(12) United States Patent
Kanai et al.

(10) Patent No.: US 7,859,351 B2
(45) Date of Patent: Dec. 28, 2010

(54) DRIVER DEVICE, PHYSICAL QUANTITY MEASURING DEVICE, AND ELECTRONIC INSTRUMENT

(75) Inventors: Masahiro Kanai, Suwa (JP); Eitaro Otsuka, Fujimi-cho (JP); Naoki Yoshida, Suwa (JP); Akihiro Fukuzawa, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 733 days.

(21) Appl. No.: 11/898,033

(22) Filed: Sep. 7, 2007

(65) Prior Publication Data

US 2009/0133496 A1   May 28, 2009

(30) Foreign Application Priority Data

Sep. 8, 2006   (JP) .............................. 2006-244009
Aug. 22, 2007   (JP) .............................. 2007-216101

(51) Int. Cl.
*H03B 5/32*   (2006.01)

(52) U.S. Cl. .................... 331/160; 331/116 R; 331/158; 310/317; 73/514.29

(58) Field of Classification Search ................. 331/160, 331/116 R, 158; 310/317; 73/514.29, 504.12
See application file for complete search history.

(56) References Cited

U.S. PATENT DOCUMENTS

| 4,578,650 | A  * | 3/1986 | Watson ........................ 331/160 |
| 7,408,309 | B2 * | 8/2008 | Wang et al. .................. 315/307 |
| 7,573,346 | B2 * | 8/2009 | Hagino ........................ 331/160 |
| 2005/0178202 | A1 * | 8/2005 | Uehara ........................ 73/497 |
| 2008/0087084 | A1 * | 4/2008 | Kanai et al. ............... 73/514.29 |
| 2008/0105054 | A1 * | 5/2008 | Kanai et al. ............... 73/514.29 |

FOREIGN PATENT DOCUMENTS

| JP | A-2003-240556 | 8/2003 |
| JP | A-2004-286503 | 10/2004 |

* cited by examiner

*Primary Examiner*—Joseph Chang
(74) *Attorney, Agent, or Firm*—Oliff & Berridge, PLC (57) ABSTRACT

An oscillation driver circuit includes a current-voltage converter which converts a current value of an oscillation signal in an oscillation loop into a voltage value, and a comparator which outputs a signal corresponding to the result of comparison between the output signal from the current-voltage converter and a given reference signal. The comparator has an output current limiting function. The oscillation driver circuit causes the vibrator to produce driving vibrations based on the output from the comparator.

9 Claims, 9 Drawing Sheets

DRIVER DEVICE, PHYSICAL QUANTITY MEASURING DEVICE, AND ELECTRONIC INSTRUMENT

Japanese Patent Application No. 2006-244009 filed on Sep. 8, 2006, and Japanese Patent Application No. 2007-216101 filed on Aug. 22, 2007 are hereby incorporated by reference in their entirety.

BACKGROUND OF THE INVENTION

The present invention relates to a driver device which causes a vibrator to produce driving vibrations, a physical quantity measuring device (e.g. vibrating gyroscope) using the driver device, and an electronic instrument.

Gyroscopes are classified as a rotating gyroscope, a vibrating gyroscope, and the like depending on the method of detecting the force exerted on an object. In particular, the vibrating gyroscope is considered to be advantageous for reducing the size and cost from the viewpoint of the constituent elements and the like. As the vibrating gyrosensor which detects the angular velocity exerted on an object, a piezoelectric vibrating gyrosensor is known which excites a crystal or a piezoelectric element which is advantageous for increasing the reliability and reducing the size. The piezoelectric vibrating gyrosensor utilizes a phenomenon in which, when the angular velocity is applied to a vibrating object, a Coriolis force occurs perpendicularly to the vibrations.

The vibrating gyrosensor is used in a wide variety of applications, such as shake detection for a video camera or a digital camera, positioning using a global positioning system (GPS) for a car navigation system, and position detection for an aircraft or a robot.

The vibrating gyrosensor used in these applications is driven by a battery. Therefore, it is necessary to increase the life of the battery by reducing the power consumption of the vibrating gyrosensor as much as possible. In this case, it is preferable to stop supplying power to the vibrating gyrosensor when the angular velocity or the like is not detected and to supply power to the vibrating gyrosensor from the battery only when using the vibrating gyrosensor. This makes it necessary to cause the vibrating gyrosensor to perform a normal operation within a short period of time after activation.

JP-A-2004-286503 and JP-A-2003-240556 disclose technologies for reducing the startup time of the vibrating gyrosensor, for example. JP-A-2004-286503 discloses technology in which a CR oscillation circuit or a ring oscillator is provided in an oscillation loop so that the oscillation amplitude is increased by an amplifier immediately after activation. JP-A-2003-240556 discloses technology in which a resistor is provided in series with a crystal vibrator to reduce the period of time until the signal from the vibrator is stabilized.

A driver device for the vibrating gyrosensor must cause the vibrator to constantly vibrate (oscillate) at a resonance frequency in order to stably detect the angular velocity exerted on the vibrator. The driver device also must cause the vibrator to oscillate within a short time to start a normal operation. Moreover, it is preferable to form the driver device using a small circuit with low power consumption in order to increase the life of the battery at low cost.

On the other hand, if the vibrator is formed of a crystal having a high Q-value and sealed in a package under vacuum, the Q-value of the vibrator increases to a large extent during drive. Therefore, the period of time (startup time) until the signal from the vibrator is stabilized increases when causing the vibrator to produce driving vibrations.

According to the technology disclosed in JP-A-2004-286503, when causing the crystal oscillator to oscillate at a frequency close to the driving frequency of the crystal oscillator, the areas of the capacitor and the resistor of the CR oscillation circuit must be increased. This results in an increase in the size and cost of the vibrating gyroscope (vibrating gyrosensor). According to the technology disclosed in JP-A-2004-286503, it is difficult to cause the crystal oscillator to operate at the driving frequency of the crystal oscillator with a high Q-value since the crystal oscillator is driven at another frequency during startup. Therefore, the period of time until stable oscillations are achieved increases when affected by a manufacturing variation and the like.

The technology disclosed in JP-A-2004-286503 requires a gain control circuit which controls the oscillation amplitude in the oscillation loop and the like in order to satisfy the oscillation conditions while preventing destruction of the vibrator, whereby the circuit scale and power consumption increase.

According to the technology disclosed in JP-A-2003-240556, it is necessary to insert a resistor. In general, when incorporating a resistor in an integrated circuit device, it is difficult to apply the desired energy to the vibrator due to a large manufacturing variation of the resistor.

According to the technology disclosed in JP-A-2003-240556, the gain is reduced because the energy applied to the vibrator is divided by the resistor. Furthermore, the technology disclosed in JP-A-2003-240556 requires a gain control circuit which controls the oscillation amplitude in the oscillation loop and the like in order to satisfy the oscillation conditions while preventing destruction of the vibrator, whereby the circuit scale and power consumption increase.

SUMMARY

According to one aspect of the invention, there is provided a driver device which is connected with a vibrator to form an oscillation loop and causes the vibrator to produce driving vibrations by applying a rectangular-wave driving signal to the vibrator when measuring physical quantity using an output signal obtained by synchronously detecting a detection signal output from the vibrator, the driver device comprising:

a current-voltage converter which converts a current value of an oscillation signal in the oscillation loop into a voltage value; and a first comparator which outputs a signal corresponding to a result of comparison between an output signal from the current-voltage converter and a given reference signal, the first comparator forming the oscillation loop together with the vibrator and having a current limiting function of limiting an amount of output current;

the driver device causing the vibrator to produce the driving vibrations based on the rectangular-wave driving signal output from the first comparator.

According to another aspect of the invention, there is provided a physical quantity measuring device for measuring physical quantity corresponding to a detection signal output from a vibrator based on driving vibrations produced by the vibrator and the physical quantity to be measured, the physical quantity measuring device comprising:

a vibrator;

the driver device as defined in the above device which causes the vibrator to produce driving vibrations; and a detection device which detects an output signal corresponding to the physical quantity based on the detection signal, the detection device including a synchronous detector which synchronously detects the detection signal based on the output from the first or second comparator.

According to a further aspect of the invention, there is provided an electronic instrument comprising the above physical quantity measuring device.

DETAILED DESCRIPTION OF THE EMBODIMENT

At least one aspect of the invention may provide a driver device (oscillation driver device) capable of achieving stable oscillations with a circuit scale as small as possible, preventing destruction of a vibrator, and reducing the oscillation startup time.

According to one embodiment of the invention, there is provided a driver device which is connected with a vibrator to form an oscillation loop and causes the vibrator to produce driving vibrations by applying a rectangular-wave driving signal to the vibrator when measuring physical quantity using an output signal obtained by synchronously detecting a detection signal output from the vibrator, the driver device comprising:

a current-voltage converter which converts a current value of an oscillation signal in the oscillation loop into a voltage value; and a first comparator which outputs a signal corresponding to a result of comparison between an output signal from the current-voltage converter and a given reference signal, the first comparator forming the oscillation loop together with the vibrator and having a current limiting function of limiting an amount of output current;

the driver device causing the vibrator to produce the driving vibrations based on the rectangular-wave driving signal output from the first comparator.

According to the invention, when measuring the physical quantity using the output signal corresponding to the detection signal output from the vibrator based on driving vibrations produced by the vibrator and the physical quantity to be measured, the driver device is used to form an oscillation loop together with the vibrator and cause the vibrator to produce driving vibrations. According to the invention, since the signal in the oscillation loop is amplified using the first comparator which outputs a signal corresponding to the result of comparison between the given reference signal and the oscillation signal during the oscillation startup and during the steady oscillation state, the oscillation startup can be accelerated using a simple configuration. Since the first comparator has the current limiting function, a driver device can be provided which prevents an excessive current from flowing toward the vibrator without controlling the oscillation amplitude, prevents destruction of the vibrator with a minimum circuit scale, and reduces the oscillation startup time.

The driver device according to this embodiment may comprise:

a second comparator which outputs a signal corresponding to a result of comparison between the output signal from the current-voltage converter and the given reference signal;

wherein the output from the second comparator may be used as a synchronous detection clock signal for generating the output signal from the detection signal.

In the driver device according to this embodiment, the output from the first comparator may be used as a synchronous detection clock signal for generating the output signal from the detection signal.

According to the above embodiment, since the output from the first or second comparator is supplied as the synchronous detection clock for generating the output signal from the detection signal, the synchronous detection process and the oscillation startup can be accelerated.

In the driver device according to this embodiment, when the first comparator is connected with a high-potential-side power supply and a low-potential-side power supply, the current limiting function may be a function of limiting current in a current path connected to at least one of the high-potential-side power supply and the low-potential-side power supply.

This enables the current limiting function of the first comparator to be easily realized.

According to another embodiment of the invention, there is provided a physical quantity measuring device for measuring physical quantity corresponding to a detection signal output from a vibrator based on driving vibrations produced by the vibrator and the physical quantity to be measured, the physical quantity measuring device comprising:

a vibrator;

the driver device as defined in the above embodiment which causes the vibrator to produce driving vibrations; and a detection device which detects an output signal corresponding to the physical quantity based on the detection signal, the detection device including a synchronous detector which synchronously detects the detection signal based on the output from the first or second comparator.

According to the above embodiment, the switching element can be switch-controlled by utilizing the signal detection result from the vibrator generally used for oscillation control of the oscillation loop. Therefore, a physical quantity measuring device can be provided which accelerates the synchronous detection process and the oscillation startup without increasing the circuit scale and achieves a reduction in size and power consumption.

In the physical quantity measuring device according to this embodiment, the detection device may include a phase shifter for adjusting phases of the output from the first or second comparator and the detection signal.

According to the above embodiment, since the phase can be adjusted according to a change in phase during the weak signal detection process, a highly accurate phase adjustment can be achieved while preventing an increase in circuit scale.

According to a further embodiment of the invention, there is provided an electronic instrument comprising the above physical quantity measuring device.

According to the above embodiment, a reduction in size and power consumption of an electronic instrument which performs given process by using a measurement result of physical quantity is achieved.

In the driver device according to this embodiment, a circuit parameter of an equivalent circuit of the vibrator and a circuit parameter of the driver device is set so that a positive impedance of the vibrator with respect to the driver device coincides with a negative impedance of the driver device with respect to the vibrator.

This enables the transition from the oscillation startup state to the steady oscillation state without using a gain control amplifier.

In the driver device according to this embodiment, when the oscillation loop is in an oscillation startup state, only a specific frequency component is selectively amplified by frequency selection due to a filtering effect of the vibrator, and, when the specific frequency component increases with passage of time and current which flows toward the vibrator has reached a current limit value of the output current of the comparator, the current is made constant so that energy supplied to the vibrator is made constant, whereby the oscillation loop transitions from the oscillation startup state to a steady oscillation state.

This reasonably enables the transition from the oscillation startup state to the steady oscillation state.

In the driver device according to this embodiment, the vibrator is a capacitive-coupling vibrator.

This makes it possible to use an arbitrary potential as the direct-current potential of the oscillation loop. Therefore, a circuit can be formed without taking the direct-current potential into account, whereby the degrees of freedom of the circuit configuration are increased.

Embodiments of the invention are described below in detail with reference to the drawings. Note that the following embodiments do not in any way limit the scope of the invention laid out in the claims. Note that all of the elements of the following embodiments should not necessarily be taken as essential requirements for the invention.

First Embodiment

The configuration and the operation of an oscillation driver circuit (driver device) according to this embodiment are described below. For example, the oscillation driver circuit according to this embodiment operates as follows.

An oscillation loop including a vibrator is driven by a rectangular wave using a comparator instead of a gain control amplifier. Since a gain control amplifier is unnecessary, the circuit configuration can be significantly simplified.

The vibrator drive method by a rectangular wave is a drive method utilizing a phenomenon in which only the alternating-current component of the resonance frequency is selected due to the frequency filtering effect of the vibrator.

The oscillation loop is driven by the comparator during the oscillation startup (e.g. when power is supplied) and during the steady oscillation state.

The oscillation loop can be driven during the oscillation startup by a rectangular wave which swings to the maximum between power supply voltages (including a voltage which may be considered to be the power supply voltage), for example. Specifically, the gain of the oscillation loop can be increased to a value larger than one. This accelerates the transition from the oscillation startup state to the steady oscillation state.

The comparator has a current limiting function for limiting the output current. The amount of current supplied to the vibrator is made constant by limiting the output current of the comparator. This means that the energy supplied to the vibrator becomes constant.

Therefore, when the amount of current which flows toward the vibrator increases with the passage of time after the oscillation startup with regard to the resonance frequency, the upper limit of the signal current is reached, whereby the energy supplied to the vibrator is made constant. This stabilizes the gain of the oscillation loop so that a stable oscillation state (steady oscillation state) automatically occurs.

Moreover, a situation in which the vibrator is destroyed due to an excessive driving current is prevented by limiting the current which flows toward the vibrator. This improves the reliability of the driver device.

The details are given below.

1. Driver Device (Configuration and Operation of Oscillation Driver Circuit)

Figure 1:
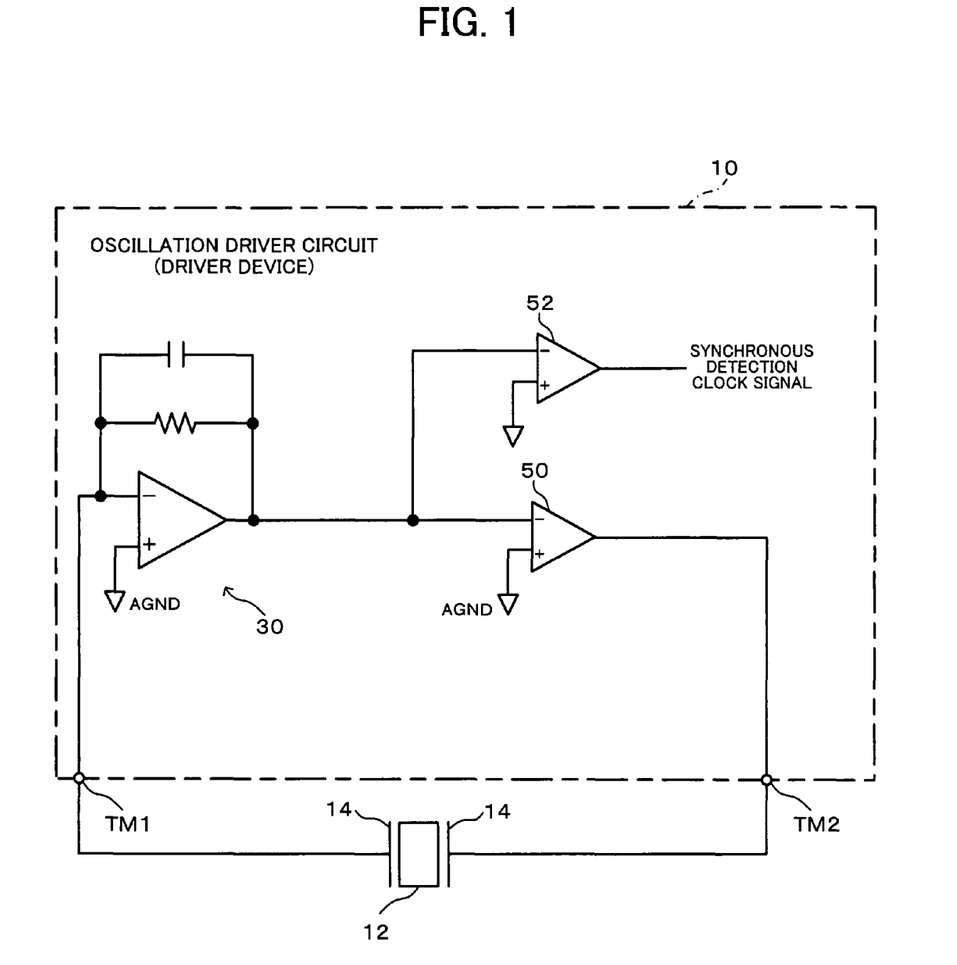
FIG. 1 is a circuit block diagram showing a configuration example of an oscillation driver circuit according to one embodiment of the invention.

FIG. 1 is a block diagram showing a configuration example of an oscillation driver circuit (driver device) according to this embodiment. The oscillation driver circuit (driver device) according to this embodiment is used to measure the physical quantity using an output signal obtained by synchronously detecting a detection signal output from a vibrator based on driving vibrations produced by the vibrator and the physical quantity to be measured.

An oscillation driver circuit 10 includes first and second connection terminals TM1 and TM2 (electrodes or pads). A vibrator 12 is inserted between the first and second connection terminals outside the oscillation driver circuit 10. Excitation means 14 are attached to the vibrator 12. The excitation means 14 are connected with the oscillation driver circuit 10 to form an oscillation loop. An oscillation start to occur in a state in which the gain of a driver in the oscillation driver circuit 10 is large (i.e., the gain is larger than one). In this state, only noise is input to the driver. The noise includes wave motions at a wide range of frequencies including the natural resonance frequency of the desired driving vibrations. The noise is input to the vibrator 12.

The vibrator 12 is formed of a piezoelectric single crystal as described later, for example. A signal containing a large amount of wave motions at the desired natural resonance frequency is output by the frequency filtering effect of the vibrator 12, and input to the driver. The above operation is repeated in the oscillation loop so that the percentage of the signal at the desired natural resonance frequency increases, whereby the amplitude of the signal input to the driver increases.

In the steady oscillation state, a current-voltage converter 30 converts the output current from the vibrator 12 into a voltage value, and a comparator 50 (first comparator) compares the output signal from the current-voltage converter 30 with an analog power supply voltage (reference voltage AGND: may include ground potential and other reference potentials) as a given reference signal.

The output from the comparator 50 causes the vibrator 12 to produce driving vibrations. Specifically, the comparator 50 outputs a signal corresponding to the result of comparison between the output signal from the current-voltage converter 30 and the analog power supply voltage (reference voltage AGND) as a given reference signal. The vibrator 12 produces driving vibrations due to the signal output from the comparator 50. In this case, the gain (loop gain) while the signal rounds the oscillation loop becomes one, and the vibrator 12 stably oscillates in this state.

Stable oscillations of the vibrator are indispensable for measurement of the physical quantity. Specifically, if the amplitude of the driving signal produced by the vibrator is not constant, the output signal from the vibrator does not become constant, whereby the physical quantity cannot be accurately measured.

It is also indispensable to accelerate the oscillation startup of the vibrator in order to reduce the power consumption of the system including the vibrator and the oscillation driver circuit. Specifically, oscillations can be produced only when required by promptly obtaining stable oscillations, whereby an operation period in which power is unnecessarily consumed can be reduced.

As described above, the oscillation driver circuit 10 according to this embodiment has a configuration in which the comparator 50 is used as the driver during the oscillation startup so that a gain control amplifier (hereinafter abbreviated as "GCA") of which the gain is dynamically adjusted and an AGC circuit which adjusts the gain of the GCA are made unnecessary. As a result, this embodiment reduces the circuit scale and power consumption.

In this embodiment, the oscillation driver circuit 10 can output a synchronous detection clock signal as a synchronous detection reference signal. Therefore, the oscillation driver circuit 10 may include a comparator 52 for outputting the synchronous detection clock signal in addition to the comparator 50. The comparator 52 (second comparator) compares the output signal from the current-voltage converter 30 with the analog power supply voltage (reference voltage AGND) as a given reference signal, and outputs the comparison result signal as the synchronous detection clock signal. The comparator 52 does not have the current limiting function possessed by the comparator 50.

According to this embodiment, when the level of the signal input to the comparator 50 has exceeded a given threshold value during the oscillation startup state such as immediately after supplying power, the comparator 50 amplifies the input signal by a very large gain to increase the gain in the oscillation loop to a value larger than one. As a result, the vibrator 12 is caused to produce driving vibrations during the oscillation startup state so that the gain in the oscillation loop including the vibrator 12 and the comparator 50 is larger than one and the phase in the oscillation loop is 360×n (n is an integer). This enables the oscillation startup time to be reduced without providing an AGC circuit.

The comparator 50 has the current limiting function. When the comparator 50 is connected with a high-potential-side power supply and a low-potential-side power supply, the current limiting function of the comparator 50 may be referred to as a function of limiting the current in the current path connected to at least one of the high-potential-side power supply and the low-potential-side power supply. This makes it possible to limit the current supplied to the vibrator 12, whereby destruction of the vibrator 12 can be prevented without providing an AGC circuit.

Therefore, oscillations continue in the steady oscillation state in the same oscillation loop as in the oscillation startup state. In this case, an excessive current is prevented from being supplied to the vibrator 12 utilizing the current limiting function of the comparator 50.

In FIG. 1, the output from the comparator 52 is supplied as the synchronous detection clock signal. Note that the comparator 52 may be omitted, and the output from the comparator 50 may be supplied as the synchronous detection clock signal. In either case, when measuring the physical quantity using the output signal obtained by synchronously detecting the detection signal output from the vibrator 12 based on driving vibrations produced by the vibrator 12 and the physical quantity to be measured, the synchronous detection process and the oscillation startup can be accelerated without increasing the circuit scale.

It is preferable to make the gain of the comparator 50 as large as possible. This makes it possible to increase the loop gain in the oscillation loop formed during the oscillation startup state, whereby the oscillation startup time can be reduced. Moreover, the accuracy of the synchronous detection clock signal output in the steady oscillation state can be increased by increasing the gain of the comparator 52.

(Current Limiting Function of Comparator)

A configuration which implements the output current limiting function of the comparator 50 is described below.

A power supply voltage VDD is supplied to the comparator 50 as the high-potential-side power supply, and the analog power supply voltage AGND is supplied to the comparator 50 as the low-potential-side power supply. The current limiting function of the comparator 50 is a function of limiting the current in the current path connected to at least one of the high-potential-side power supply and the low-potential-side power supply.

Figure 2:
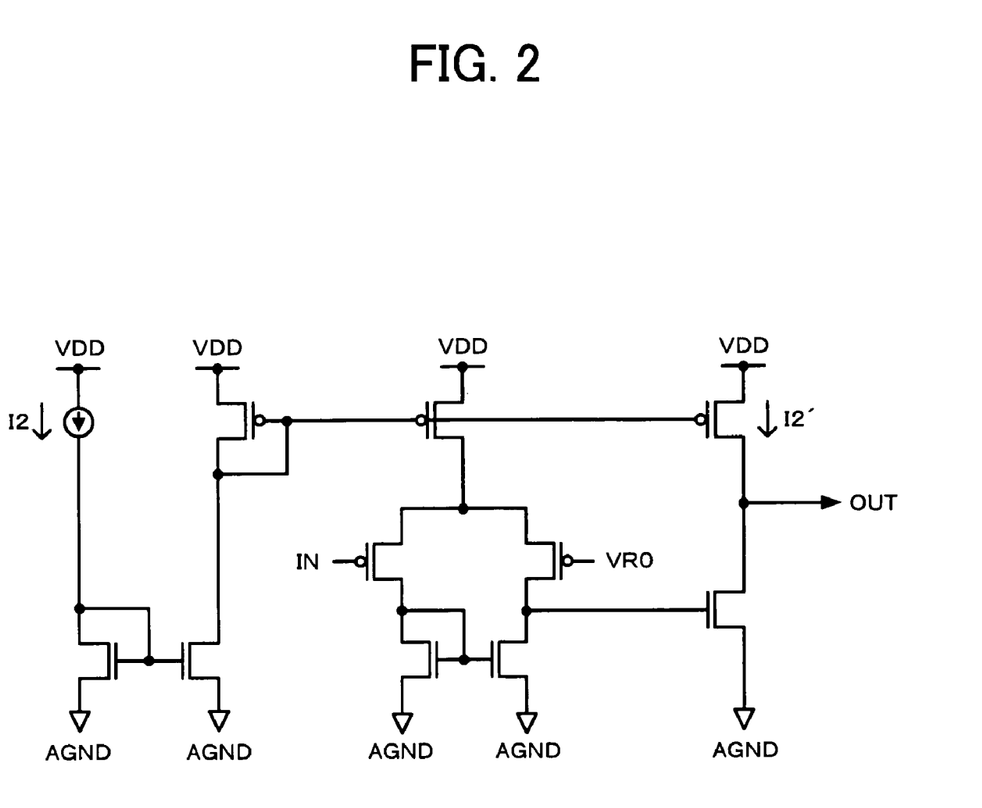
FIG. 2 is a circuit diagram showing a configuration example of a comparator shown in FIG. 1.

FIG. 2 is a circuit diagram showing a configuration example of the comparator 50 shown in FIG. 1.

In FIG. 2, a current I2 generated by a current source is supplied as the operating current of a P-type differential amplifier through two current-mirror circuits, and is supplied as a drain current I2' of a P-type output driver transistor. The voltage of the output node of the current-voltage converter 30 is supplied to the gate of one of a pair of P-type differential transistors of the P-type differential amplifier as an input signal IN. A reference voltage VR0 is supplied to the gate of the other P-type differential transistor of the P-type differential amplifier. The output voltage of the P-type differential amplifier is supplied as a gate voltage of an N-type output driver transistor.

The P-type output driver transistor and the N-type output driver transistor are connected in series between the power supply voltage VDD and the analog power supply voltage AGND, and the voltage of the connection node of the P-type output driver transistor and the N-type output driver transistor (drain of the P-type output driver transistor) is output as the output voltage.

In the comparator 50 shown in FIG. 1, the high-potential-side current drive capability of the output voltage OUT is limited by the current I2'. For example, the high-potential-side current drive capability is limited in FIG. 2 as compared with a configuration in which the same signal is supplied to the gates of the P-type output driver transistor and the N-type output driver transistor.

The configuration of the comparator 50 is not limited to the configuration shown in FIG. 2.

Figure 3:
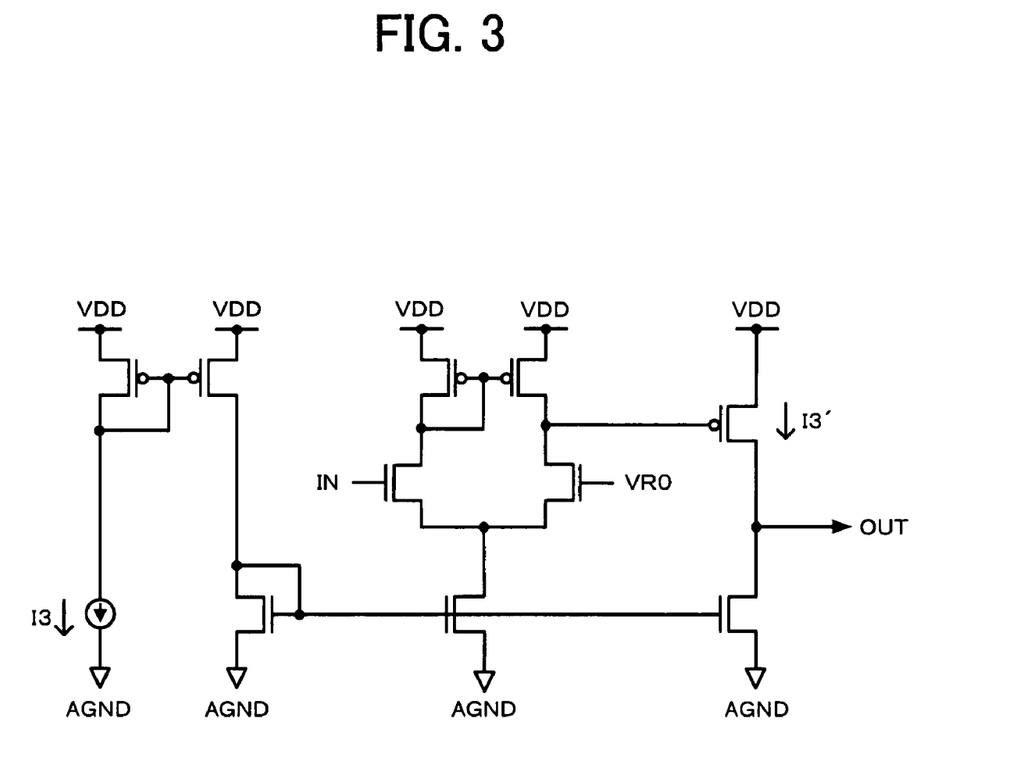
FIG. 3 is a circuit diagram showing another configuration example of the comparator shown in FIG. 1.

FIG. 3 is a circuit diagram showing another configuration example of the comparator 50 shown in FIG. 1.

In FIG. 3, a current I3 generated by a current source is supplied as the operating current of an N-type differential amplifier through two current-mirror circuits, and is supplied as a drain current I3' of an N-type output driver transistor. The voltage of the output node of the current-voltage converter 30 is supplied to the gate of one of a pair of N-type differential transistors of the N-type differential amplifier as the input signal IN. The reference voltage VR0 is supplied to the gate of the other N-type differential transistor of the N-type differential amplifier. The output voltage of the N-type differential amplifier is supplied as a gate voltage of a P-type output driver transistor.

The P-type output driver transistor and the N-type output driver transistor are connected in series between the power supply voltage VDD and the analog power supply voltage AGND, and the voltage of the connection node of the P-type output driver transistor and the N-type output driver transistor (drain of the N-type output driver transistor) is output as the output voltage.

In the comparator 50 shown in FIG. 3, the high-potential-side current drive capability of the output voltage OUT is limited by the current I3'. For example, the high-potential-side current drive capability is limited in FIG. 3 as compared with a configuration in which the same signal is supplied to the gates of the P-type output driver transistor and the N-type output driver transistor.

In FIGS. 2 and 3, the current in the current path connected to at least one of the high-potential-side power supply and the low-potential-side power supply is limited. Note that the current in the current paths connected to the high-potential-side power supply and the low-potential-side power supply may be limited.

Figure 4:
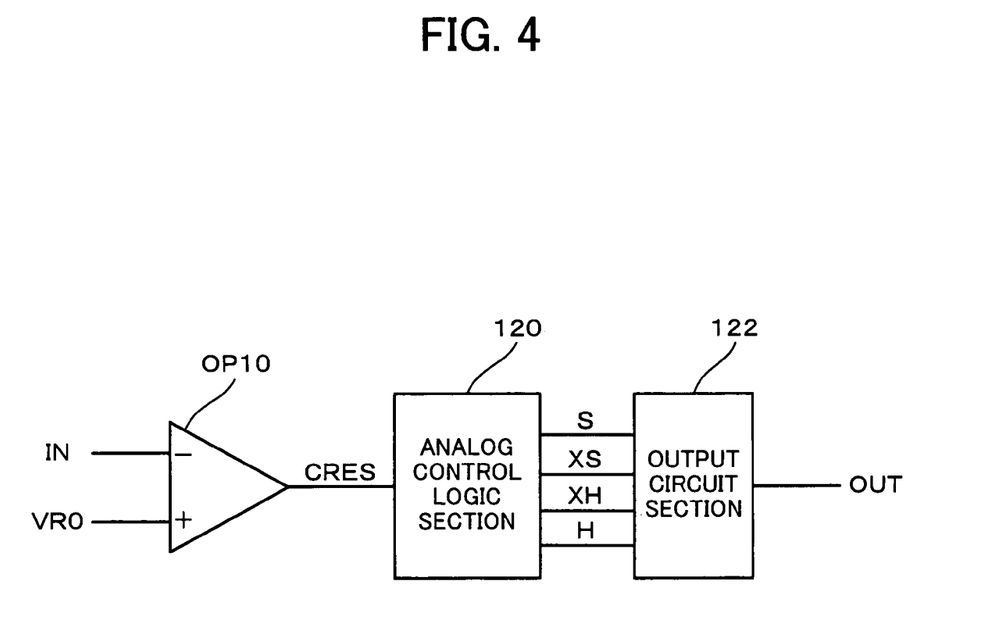
FIG. 4 is a circuit diagram showing still another configuration example of the comparator shown in FIG. 1.

FIG. 4 is a circuit diagram showing still another configuration example of the comparator 50 shown in FIG. 1.

In FIG. 4, the comparator 50 may include an operational amplifier OP10, an analog control logic section 120, and an output circuit section 122. The operational amplifier OP10 functions as a comparator. The operational amplifier OP10 compares the output signal from the current-voltage converter 30 as the input signal with the reference voltage VR0, and outputs a comparison result signal CRES. The analog control logic section 120 generates control signals S, XS, XH, and H which control the output circuit section 122 based on the comparison result signal CRES generated by the operational amplifier OP10. The output circuit section 122 generates the output signal while limiting the current supplied from the high-potential-side power supply or the current supplied to the low-potential-side power supply based on the control signals S, XS, XH, and H from the analog control logic section 120.

Figure 5A:
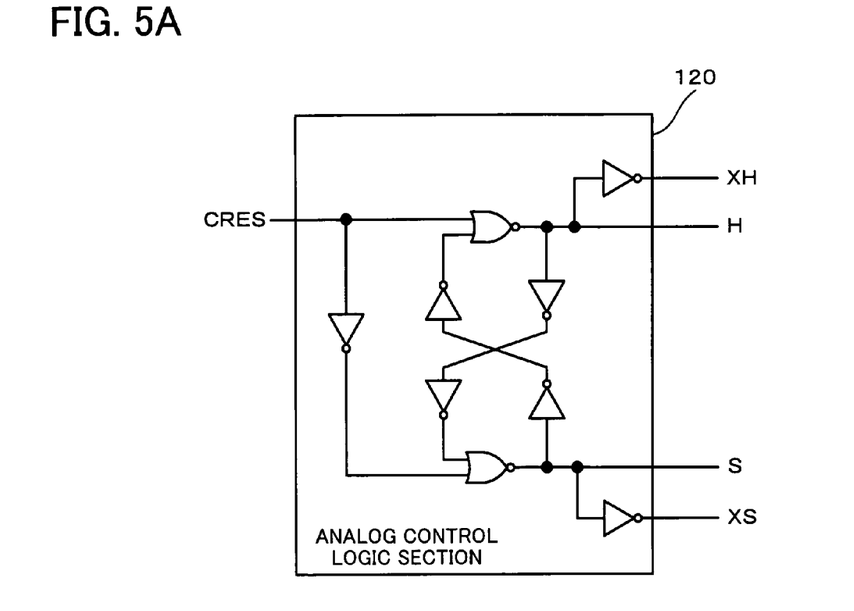
FIG. 5A is a circuit diagram showing a configuration example of an analog control logic section shown in FIG. 4.
Figure 5B:
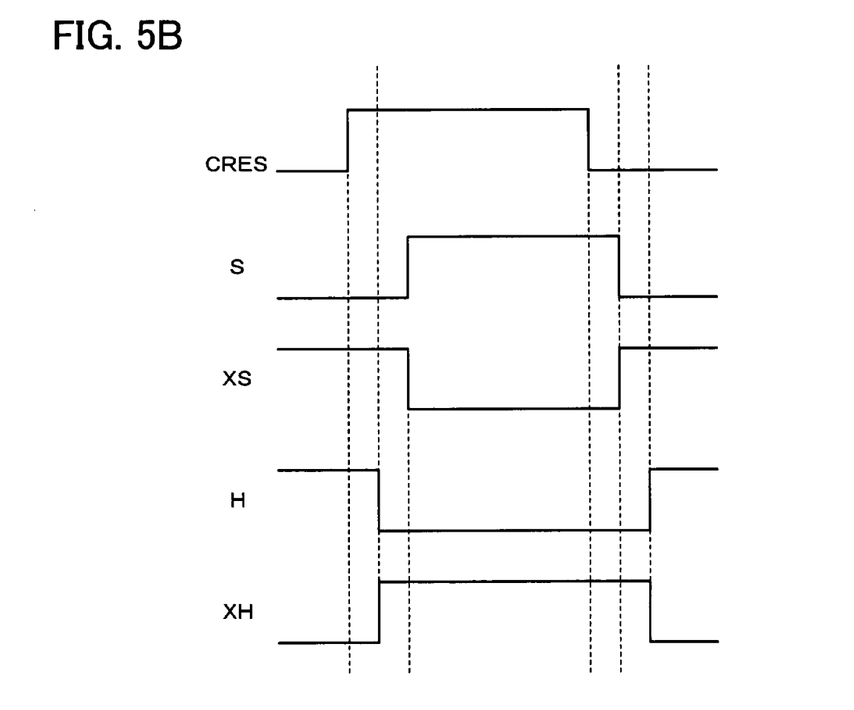
FIG. 5B is a timing diagram showing an operation example of the analog control logic section shown in FIG. 5A.

FIG. 5A is a circuit diagram showing a configuration example of the analog control logic section 120 shown in FIG. 4. FIG. 5B is a timing diagram showing an operation example of the analog control logic section 120 shown in FIG. 5A.

The analog control logic section 120 generates the control signals S and H based on the comparison result signal CRES so that the change timings of the control signals S and H differ from each other. The control signal XS is an inversion signal of the control signal S. The control signal XH is an inversion signal of the control signal H. In FIG. 5A, the comparison result signal CRES and its inversion signal are respectively input to two-input, one-output NOR circuits. The other input signal of the first NOR circuit is a signal generated by delaying the output signal from the second NOR circuit, and the other input signal of the second NOR circuit is a signal generated by delaying the output signal from the first NOR circuit. According to this configuration, the control signal H rises based on the falling edge of the control signal S, and the control signal S rises based on the falling edge of the control signal H.

Therefore, the control signals S and H are generated so that the H-level periods do not overlap. Likewise, the control signals XS and XH are generated so that the L-level periods do not overlap.

Figure 6:
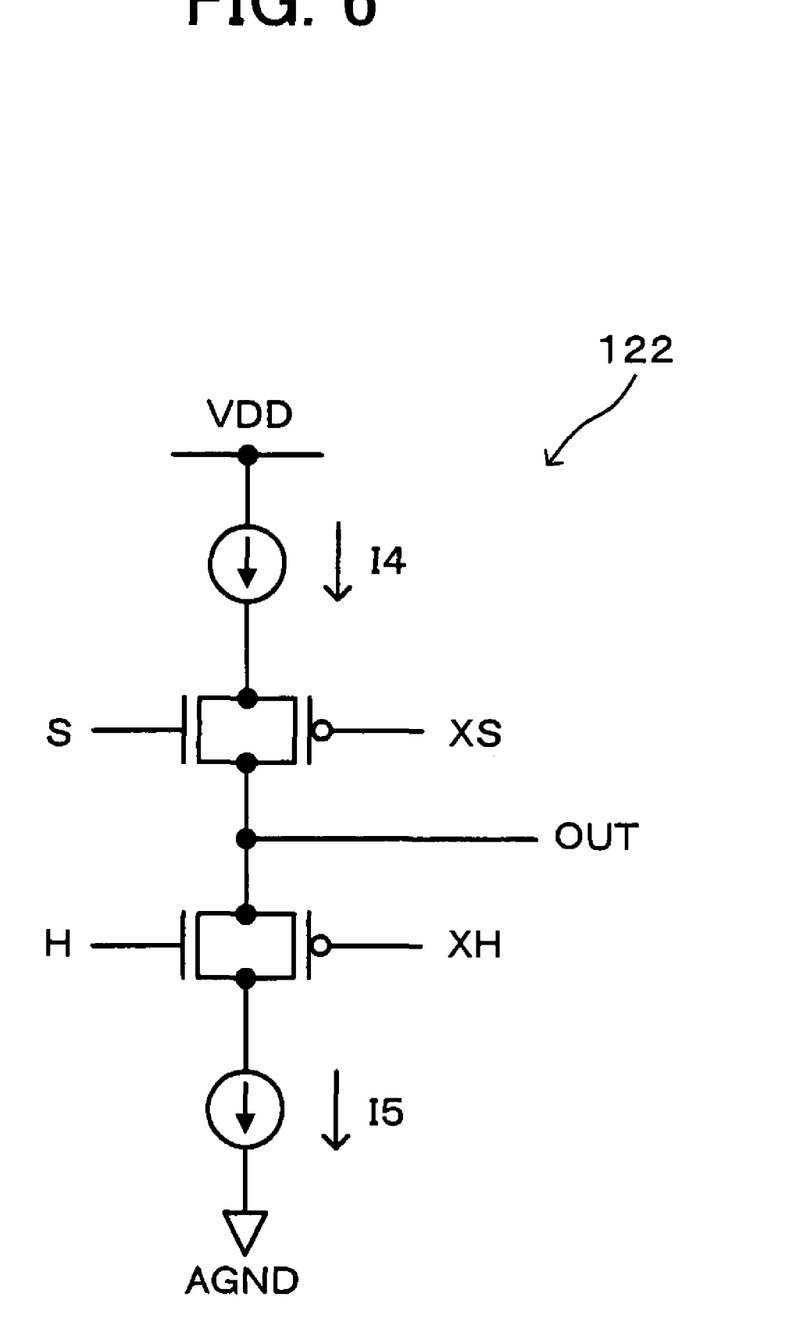
FIG. 6 is a view showing a configuration example of an output circuit section shown in FIG. 4.

FIG. 6 shows a configuration example of the output circuit section 122 shown in FIG. 4.

The output circuit section 122 includes first and second transfer gates, a first current source to which the power supply voltage VDD is supplied at one end and the first transfer gate is connected at the other end, and a second current source to which the second transfer gate is connected at one end and the analog power supply voltage AGND is supplied at the other end. The first current source generates a current I4. The second current source generates a current I5. The first and second transfer gates are connected in series, and the voltage of the connection node of the first and second transfer gates is output as the output voltage OUT of the comparator 50.

The control signals XS and S are respectively supplied to the gates of a P-type transistor and an N-type transistor forming the transfer gate connected with the first current source. The control signals XH and H are respectively supplied to the gates of a P-type transistor and an N-type transistor forming the transfer gate connected with the second current source.

According to this configuration, the first and second transfer gates are controlled so that these transfer gates are not turned ON at the same time. The second transfer gate is turned OFF when the first transfer gate is turned ON, whereby the output voltage OUT changes in a state in which the current is limited by the current I4 of the first current source. Likewise, the first transfer gate is turned OFF when the second transfer gate is turned ON, whereby the output voltage OUT changes in a state in which the current is limited by the current I5 of the second current source.

(Supplementary Examination on Transition from Oscillation Startup State to Steady Oscillation State)

The method of driving the oscillation loop using the comparator is examined below in more detail.

For example, a crystal vibrator has a plurality of resonance frequencies depending on the oscillation mode. The vibrator may be shown by an equivalent circuit diagram illustrated in FIG. 8 with regard to one of the resonance frequencies. L1 is an extremely large value, and C1 is an extremely small value. R1 is determined by the internal friction, the mechanical vibration loss, and the environmental conditions of the vibrator.

The oscillation frequency of the crystal vibrator is generally set in a frequency region exhibiting inductivity. For example, a vibrating gyroscope is caused to oscillate at a frequency around a mechanical resonance frequency fs.

Figure 8:
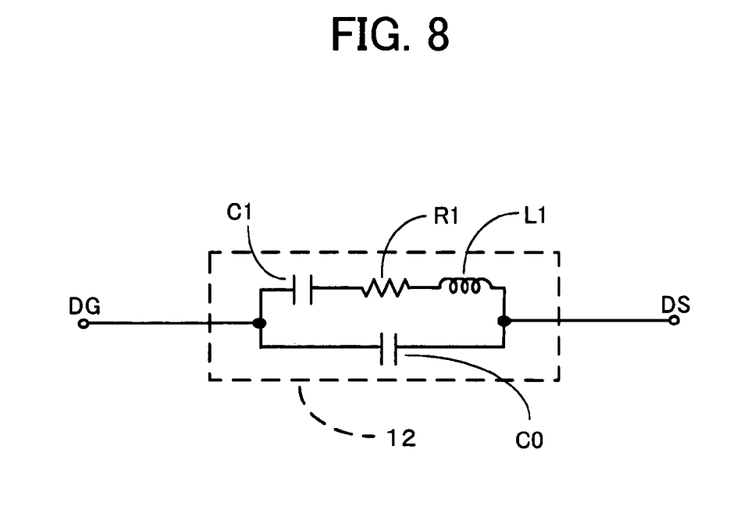
FIG. 8 is an equivalent circuit diagram of a vibrator.
Figure 9A:
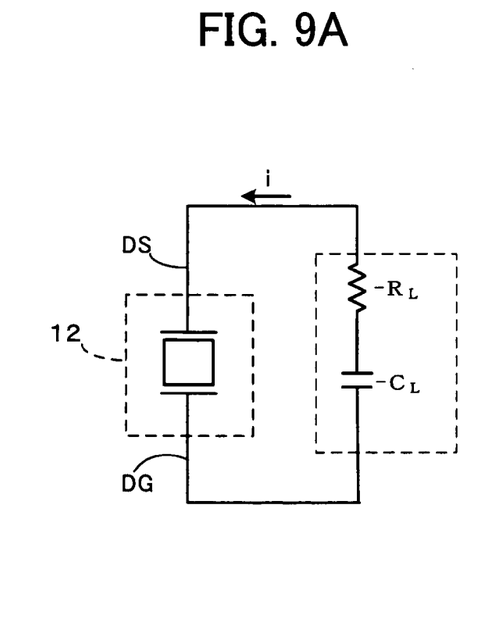
FIGS. 9A and 9B are equivalent circuit diagrams of a closed loop formed by the vibrator and the oscillation driver circuit.

FIG. 9A shows a closed loop formed by connecting the vibrator 12 and the oscillation driver circuit 10. As shown in FIG. 8, the vibrator 12 can be considered to be a series connection of a resistor ($R_e$) and an inductor ($L_e$) (coupling capacitor is disregarded). Therefore, the circuit shown in FIG. 9A is equivalent to the circuit shown in FIG. 9B.

Figure 9B:
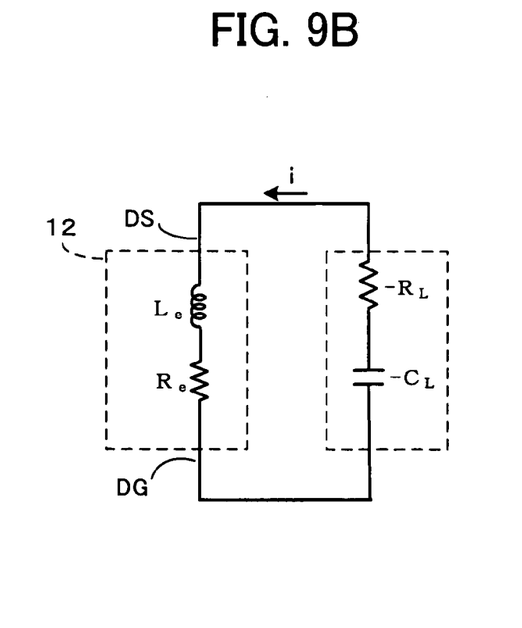

The resistor ($-R_L$) shown in FIG. 9B is called a negative resistor, and is realized by an active element forming the oscillation driver circuit 10. The negative resistor is a concept obtained from the circuit equation of the oscillation loop, and apparently has a negative resistance value.

When the oscillation loop is in a steady oscillation state, the loop gain is maintained at one so that the total energy in the oscillation loop does not change.

Therefore, if the energy consumed by the resistor ($+R_e$) of the vibrator 12 is equal to the energy acquired by the negative resistor ($-R_L$) of the oscillation driver circuit 10, the total energy in the oscillation loop does not change so that the oscillations stably continue.

The circuit equation is as follows.

$$L_e \frac{di}{dt} + (R_e - R_L)i + \frac{1}{C_L}q = 0 \qquad (1\text{-}5)$$

Calculating the transient response of i on the assumption that q(0)=0 and i(0)=0 as the initial conditions yields the following equation.

$$i(t) = i_0 e^{-\xi\omega_n t}\cos(\omega_n\sqrt{1-\xi^2}\cdot t) \qquad (1\text{-}6)$$

Where, $$\omega_n = \frac{1}{\sqrt{L_e C_L}} \quad \xi = \frac{R_e - R_L}{2\omega_n L_e} \qquad (1\text{-}7)$$

provided that $-1<\zeta<1$.

Therefore, the following items are obtained with regard to the oscillation state.

(1) When $R_L < R_e$ ($\zeta > 0$)

i(t) undergoes damped vibration.

(2) When $R_L = R_e$ ($\zeta = 0$)

$i(t) = i_0 \cos \omega_n t$ so that i(t) undergoes constant vibration.

(3) When $R_L > R_e$ ($\zeta < 0$)

i(t) undergoes increased vibration.

The following oscillation condition is obtained from these items.

When $R_L = R_e$, the circuit oscillates at a frequency at which $$\omega_n = \frac{1}{\sqrt{L_e C_L}}$$

is satisfied.

The condition $R_L > R_e$ is necessary during the oscillation startup. The startup time depends on $\zeta$. Specifically, the startup time depends on the Q-value and the negative resistance value $R_L$.

As is clear from the above examination, even if the vibrator is driven using a comparator instead of a gain control amplifier (GCA), if the impedance Re of the vibrator 12 with respect to the oscillation driver circuit 10 coincides with the negative impedance $R_L$ of the oscillation driver circuit with respect to the vibrator 12, oscillations are automatically stabilized so that a steady oscillation state is realized.

The negative impedance $R_L$ is realized in the oscillation driver circuit 10 as demonstrated below.

Figure 10:
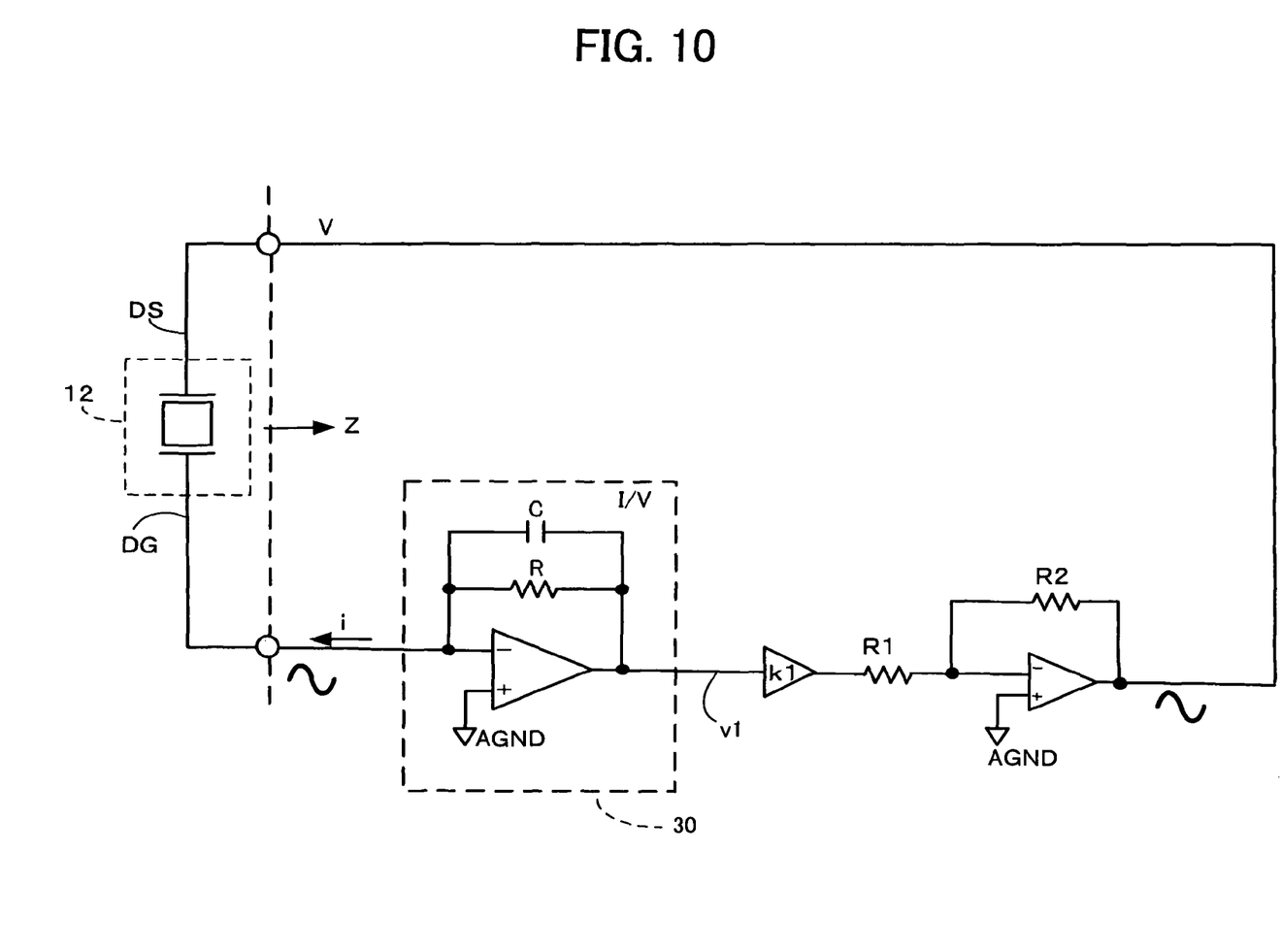
FIG. 10 is a view illustrative of the impedance of the oscillation driver circuit with respect to the vibrator.

In FIG. 10, the impedance of the oscillation driver circuit 10 with respect to the vibrator 12 is indicated by Z.

FIG. 10 assumes the case where the vibrator 12 is driven by a sine wave for convenience of description. In this embodiment, the vibrator 12 is driven by a sine wave. The following description can also be applied to the case of driving the vibrator 12 by a rectangular wave.

In FIG. 10, the voltage of the output terminal of the I/V amplifier 30 is indicated by v1. The following equations (1-8) to (1-11) are satisfied in the oscillation driver circuit shown in FIG. 10.

$$v_1 = \frac{\frac{R}{j\omega C}}{R + \frac{1}{j\omega C}} \cdot i \qquad (1\text{-}8)$$

$$v = -k \cdot \frac{R_2}{R_1}v_1 = -k \cdot \frac{R_2}{R_1} \cdot \frac{\frac{R}{j\omega C}}{R + \frac{1}{j\omega C}} \cdot i \qquad (1\text{-}9)$$

$$= k \cdot \frac{R_2}{R_1} \cdot \frac{R}{1+\omega^2 C^2 R} \cdot (-1+j\omega CR) \cdot i \qquad (1\text{-}10)$$

$$Z = \frac{v}{i} = k \cdot \frac{R_2}{R_1} \cdot \frac{R}{1+\omega^2 C^2 R} \cdot (-1+j\omega CR) \qquad (1\text{-}11)$$

The following description focuses on the equation (1-11). The impedance Z of the oscillation driver circuit 10 with respect to the vibrator 12 is expressed by a series connection of the negative resistor (portion with a negative sign) and the inductive reactor (jωCR). Specifically, the negative resistor is actually realized.

Therefore, Re=$R_L$ can be achieved during the actual oscillation process by adjusting each value of the equivalent circuit of the vibrator and each circuit parameter of the oscillation driver circuit in advance so that the impedance (Re) of the vibrator 12 with respect to the oscillation driver circuit 10 coincides with the negative impedance ($R_L$) of the oscillation driver circuit with respect to the vibrator 12.

Specifically, at least one of the impedance, the inductance, and the capacitance of the equivalent circuit of the vibrator 12 shown in FIG. 8 is optimized, for example. Likewise, at least one of the impedance and the capacitance of the equivalent circuit of the driver device 10 (oscillation driver circuit) shown in FIGS. 9A and 9B is optimized. This enables Re=$R_L$ to be achieved during the actual oscillation process.

If the impedance (Re) of the vibrator 12 with respect to the oscillation driver circuit 10 and the negative impedance ($R_L$) of the oscillation driver circuit with respect to the vibrator 12 do not change with the passage of time, it suffices that the energy applied to the vibrator be always constant in order to maintain stable oscillations. This means that it suffices that the current supplied to the vibrator be constant.

The output current of the comparator is limited, as described above. Therefore, current supplied to the vibrator is constant. Accordingly, the oscillation loop shown in FIG. 1 automatically achieves a stable steady oscillation state without using a gain control amplifier.

The transition from the oscillation startup state to the steady oscillation state is as follows.

(1) Immediately after Supplying Power

When supplying power, a specific frequency does not exist in the circuit loop. However, since noise necessarily exists in an electric circuit, general noise exists over the entire frequency band.

(2) Frequency Selection by Vibrator

A frequency is selected by the filtering effect of the vibrator. The vibrator allows only a specific frequency component (resonance frequency component) to pass through. Specifically, only a specific frequency (i.e., frequency determined by the inductance and the capacitance of the equivalent circuit of the vibrator: generally the resonance frequency) is selectively amplified from the noise in the electric circuit.

(3) Increase in Resonance Frequency Component

The frequency which has passed through the vibrator increases as compared with the noise.

The comparator drives the vibrator by the output which swings to the maximum between the power supply voltages, for example. Since the oscillation loop is driven under conditions where the loop gain is larger than one, the amount of current which flows toward the vibrator rapidly increases.

(4) Activation of Current Limiter

When the amount of current which flows toward the vibrator rapidly increases with regard to the resonance frequency, the current limit value of the comparator is reached, whereby the amount of current is made constant. Therefore, the amount of current which flows toward the vibrator (i.e., energy supplied to the vibrator) becomes constant.

As described above, the impedance (Re) of the vibrator 12 with respect to the oscillation driver circuit 10 coincides with the negative impedance ($R_L$) of the oscillation driver circuit with respect to the vibrator 12. The energy supplied to the vibrator is constant. Therefore, a stable oscillation state (steady oscillation state) is achieved when the oscillation conditions (loop gain is one or more and the phase is 360°×n) are satisfied.

According to the embodiment of the invention, a steady oscillation state is automatically achieved, even if the vibrator is driven using a comparator instead of a gain control amplifier. Since a gain control amplifier is not used, the circuit configuration is significantly simplified.

Moreover, since the vibrator is driven by a rectangular wave during the oscillation startup while increasing the loop gain to a value larger than one, high-speed startup properties can be reasonably realized.

A steady oscillation state can be achieved by limiting the amount of output current of the comparator. In addition, destruction of the vibrator due to an excessive driving current is prevented.

(Power Supply Voltage of Oscillation Driver Circuit)

The oscillation driver circuit 10 shown in FIG. 1 operates between the power supply voltage VDD (high-potential-side power supply) and the power supply voltage AGND (analog ground: low-potential-side power supply). The power supply voltage AGND includes a ground potential. Note that the power supply voltage AGND may be set at a potential other than the ground potential.

Specifically, the power supply potential which may be used differs depending on the type of the vibrator 12.

When the vibrator 12 is a capacitive-coupling transducer (configuration in which a direct-current blocking capacitor lies in the signal path in the internal equivalent circuit), direct current is cut off. Therefore, with regard to the direct current level (bias point) of the oscillation loop, it suffices that the voltage amplitude of the driving signal of the oscillation loop be adjusted regardless of the circuit operation. Therefore, an arbitrary potential may be basically used as the low-potential-side power supply, for example.

When the vibrator 12 is a variable-resistance transducer, it is necessary to set the bias voltage of the oscillation loop at a desired level. Therefore, a reference voltage at a desired level in the circuit is generally used.

As the power supply method, a single power supply method (method using only positive power supply) and a dual power supply method (method using positive and negative power supplies) can be given. The latter method is used particularly when accuracy is important.

The invention may employ either of the above power supply methods. In FIG. 1 (and other drawings), the vibrator 12 is a capacitive-coupling transducer as is clear from the equivalent circuit shown in FIG. 8. The above description has been given on the assumption that a single power supply method is employed and the oscillation driver circuit 200 operates between the power supply voltage VDD (e.g. 5 V) and the ground potential.

(Type of Vibrator)

In this embodiment, a capacitive-coupling vibrator is used as the vibrator 12, as described above. Note that the vibrator 12 is not limited thereto. Various vibrators such as a variable-resistance vibrator may also be used.

The capacitive-coupling vibrator (capacitive vibrator) is a vibrator in which a direct-current blocking capacitor lies in the signal path in the internal equivalent circuit, as shown in FIG. 8. A piezoelectric element can be given as an example of the capacitive-coupling vibrator (capacitive vibrator).

When using the capacitive-coupling vibrator, an arbitrary potential may be used as the direct-current potential of the oscillation loop. Therefore, a circuit can be formed without taking the direct-current potential into account, whereby the degrees of freedom of the circuit configuration are increased.

2. Vibrating Gyrosensor

Figure 7:
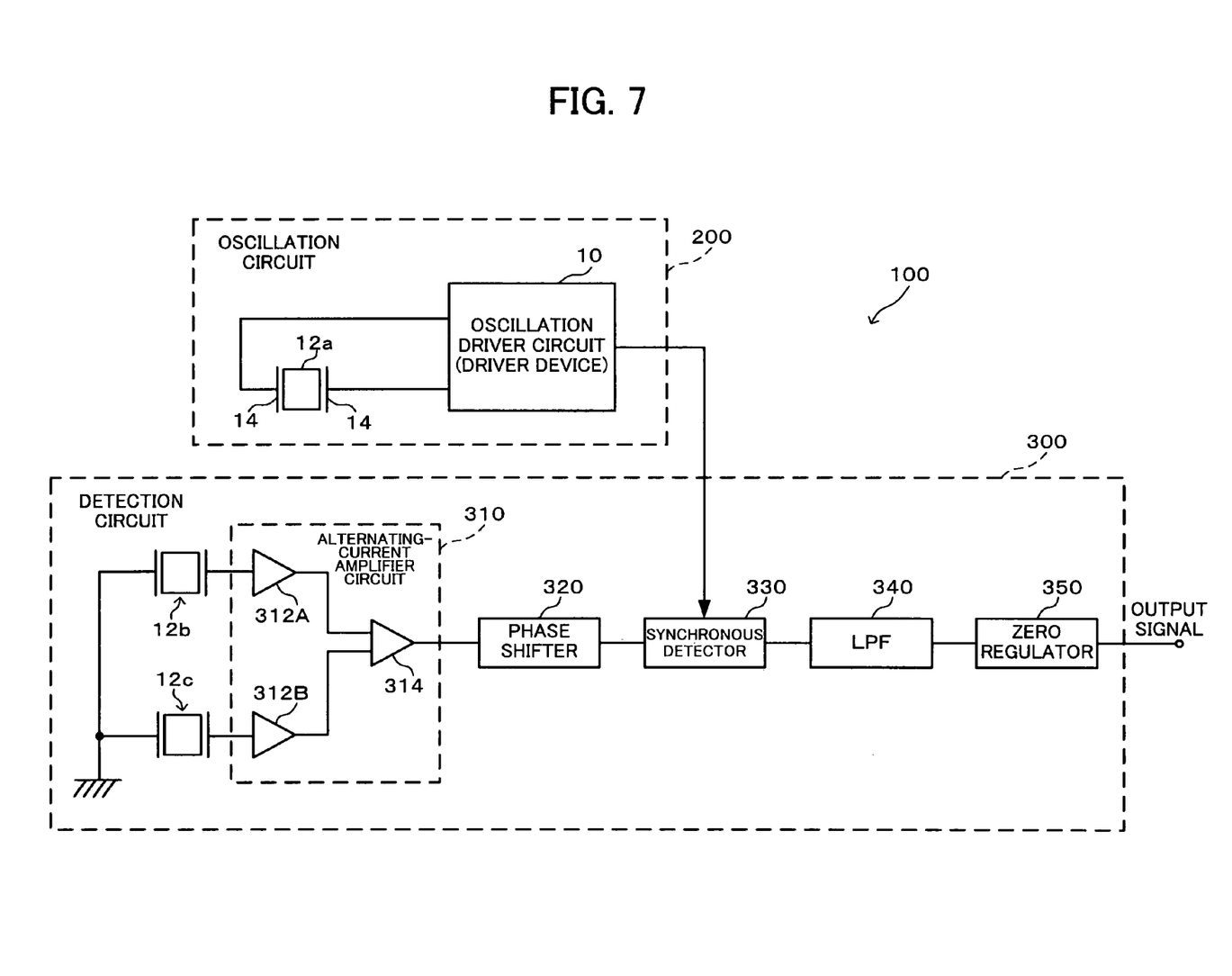
FIG. 7 is a block diagram showing a configuration example of a vibrating gyrosensor according to one embodiment of the invention.

FIG. 7 is a block diagram showing a configuration example of a vibrating gyrosensor to which the oscillation driver circuit 10 according to this embodiment is applied.

In FIG. 7, the same sections as in FIG. 1 are indicated by the same symbols. Description of these sections is appropriately omitted.

A vibrating gyrosensor 100 (physical quantity measuring device in a broad sense) includes an oscillation circuit 200 and a detection circuit 300 (detection device in a broad sense). The oscillation circuit 200 includes the vibrator 12 and the oscillation driver circuit 10. The oscillation driver circuit 10 causes a driving vibration section 12a of the vibrator 12 to vibrate.

During the oscillation startup, the output from the comparator 50 is input to the oscillation driver circuit 10 as noise. The noise is subjected to frequency selection while passing through the driving vibration section 12a of the vibrator 12.

The amplitude of the signal subjected to frequency selection while passing through the vibrator 12a increases immediately after the oscillation startup. However, an excessive current is not supplied to the vibrator 12a due to the current limiting function of the comparator 50 so that the loop gain around the oscillation loop is one or more.

When the oscillation state of the driving signal has been stabilized, signals from driving detection sections 12b and 12c of the vibrator 12 start to be detected. Specifically, the detection signals (alternating-current) from the driving detection sections 12b and 12c of the vibrator are amplified using alternating-current amplifiers 312A and 312B of an alternating-current amplifier circuit 310, and the outputs from the amplifiers 312A and 312B are summed up by an adder 314.

The output of the adder 314 is caused to pass through a phase shifter 320 to obtain a phase shift signal. The phase of the phase shift signal differs from the phase of the synchronous detection clock signal which is the output from the comparator 52 or the comparator 50 of the oscillation driver circuit 10 by a specific angle such as 90°. The phase shift signal and the synchronous detection clock signal from the oscillation driver circuit 10 are input to a synchronous detector 330 to detect the output signal from the vibrator 12. As a result, an unnecessary leakage signal is removed or at least reduced from the detected output signal. Since the phase can be adjusted according to a change in phase during the weak signal detection process by adjusting the phases of the synchronous detection clock signal and the detection signal using the detection circuit 300, a highly accurate phase adjustment can be achieved while preventing an increase in circuit scale.

The detected output signal is input to a low-pass filter 340, smoothed, and input to a zero regulator 350. The output from the zero regulator 350 is removed as an output signal corresponding to the physical quantity (e.g. angular velocity) to be measured.

The vibrating gyrosensor 100 shown in FIG. 7 is preferably provided in electronic instruments such as a video camera, a digital camera, a car navigation system, an aircraft, and a robot.

The invention is not limited to the vibrator 12 according to this embodiment. As examples of the material for the vibrator 12, constant modulus alloys such as elinvar and ferroelectric single crystals (piezoelectric single crystals) can be given. As examples of such single crystals, a crystal, lithium niobate, lithium tantalate, a lithium niobate-lithium tantalate solid solution, lithium borate, and langasite can be given. It is preferable that the vibrator 12 be hermetically sealed in a package. It is preferable that the package be filled with dry nitrogen or be under vacuum.

The physical quantity measured according to the invention is not limited to the angular velocity illustrated in this embodiment. The invention aims at a physical quantity which can be detected from a change in vibration state using a detection circuit when the vibrator is caused to produce driving vibrations and the vibration state of the vibrator has changed due to the effects of the physical quantity on the vibrator producing driving vibrations. As such a physical quantity, acceleration and angular acceleration are particularly preferred in addition to the angular velocity applied to the vibrator. As the detection device, an inertial sensor is preferred.

Although only some embodiments of the invention have been described above in detail, those skilled in the art would readily appreciate that many modifications are possible in the embodiments without materially departing from the novel teachings and advantages of the invention. Accordingly, such modifications are intended to be included within the scope of the invention.

What is claimed is:

1. A driver device which is connected with a vibrator to form an oscillation loop and causes the vibrator to produce driving vibrations by applying a rectangular-wave driving signal to the vibrator when measuring physical quantity using an output signal obtained by synchronously detecting a detection signal output from the vibrator, the driver device comprising:
a current-voltage converter which converts a current value of an oscillation signal in the oscillation loop into a voltage value; and
a first comparator which outputs a signal corresponding to a result of comparison between an output signal from the current-voltage converter and a given reference signal, the first comparator being connected with a high-potential-side power supply and a low-potential-side power supply, forming the oscillation loop together with the vibrator and having a current limiting function of limiting an amount of output current, the current limiting function being a function of limiting current in a current path connected to at least one of the high-potential-side power supply and the low-potential-side power supply; the driver device causing the vibrator to produce the driving vibrations based on the rectangular-wave driving signal output from the first comparator.

2. The driver device as defined in claim 1, comprising:
a second comparator which outputs a signal corresponding to a result of comparison between the output signal from the current-voltage converter and the given reference signal;
wherein the output from the second comparator is used as a synchronous detection clock signal for generating the output signal from the detection signal.

3. The driver device as defined in claim 1, wherein the output from the first comparator is used as a synchronous detection clock signal for generating the output signal from the detection signal.

4. A physical quantity measuring device for measuring physical quantity corresponding to a detection signal output from the vibrator based on driving vibrations produced by the vibrator and the physical quantity to be measured, the physical quantity measuring device comprising:
the driver device as defined in claim 1 which causes the vibrator to produce driving vibrations; and
a detection device which detects an output signal corresponding to the physical quantity based on the detection signal, the detection device including a synchronous detector which synchronously detects the detection signal based on the output from the first or second comparator.

5. The physical quantity measuring device as defined in claim 4, wherein the detection device includes a phase shifter for adjusting phases of the output from the first or second comparator and the detection signal.

6. An electronic instrument comprising the physical quantity measuring device as defined in claim 4.

7. The driver device as defined in claim 1, wherein a circuit parameter of an equivalent circuit of the vibrator and a circuit parameter of the driver device are set so that a positive impedance of the vibrator with respect to the driver device coincides with a negative impedance of the driver device with respect to the vibrator.

8. The driver device as defined in claim 7, wherein, when the oscillation loop is in an oscillation startup state, only a specific frequency component is selectively amplified by frequency selection due to a filtering effect of the vibrator, and, when the specific frequency component increases with passage of time and current which flows toward the vibrator has reached a current limit value of the output current of the comparator, the current is made constant so that energy supplied to the vibrator is made constant, whereby the oscillation loop transitions from the oscillation startup state to a steady oscillation state.

9. The driver device as defined in claim 1, wherein the vibrator is a capacitive-coupling vibrator.

* * * * *